(12) United States Patent
Chen et al.

(10) Patent No.: US 10,236,222 B2
(45) Date of Patent: Mar. 19, 2019

(54) SYSTEM AND METHOD FOR MEASURING SUBSTRATE AND FILM THICKNESS DISTRIBUTION

(71) Applicant: KLA-Tencor Corporation, Milpitas, CA (US)

(72) Inventors: Dengpeng Chen, Singapore (SG); Andrew Zeng, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/622,629

(22) Filed: Jun. 14, 2017

(65) Prior Publication Data

US 2018/0226304 A1 Aug. 9, 2018

Related U.S. Application Data

(60) Provisional application No. 62/456,651, filed on Feb. 8, 2017.

(51) Int. Cl.
| | |
|---|---|
| *H01L 29/40* | (2006.01) |
| *H01L 21/44* | (2006.01) |
| *H01L 21/66* | (2006.01) |
| *H01L 21/67* | (2006.01) |
| *G01B 21/08* | (2006.01) |

(52) U.S. Cl.
CPC .............. *H01L 22/12* (2013.01); *G01B 21/08* (2013.01); *H01L 21/67253* (2013.01)

(58) Field of Classification Search
CPC ................................................ H01L 21/67253

USPC .................. 438/674, 679; 257/629, 750, 773
See application file for complete search history.

(56) References Cited

U.S. PATENT DOCUMENTS

| | | | |
|---|---|---|---|
| 5,416,594 A | 5/1995 | Gross et al. | |
| 5,625,170 A | 4/1997 | Poris | |
| 6,038,028 A | 3/2000 | Grann et al. | |
| 6,249,351 B1 * | 6/2001 | de Groot | G01B 11/30 356/512 |

(Continued)

OTHER PUBLICATIONS

Hamatsu, "Optical Gauge Series, Optical NanoGauge, Optical MicroGauge", 2016 Edition, 20 pages, Product:https://www.hamamatsu.com/resources/pdf/sys/SSMS0043E_OGauges.pdf(p. 10).

(Continued)

*Primary Examiner* — Calvin Lee
(74) *Attorney, Agent, or Firm* — Suiter Swantz pc llo

(57) ABSTRACT

The system includes a dual interferometer sub-system configured to measure flatness across a substrate. The system includes a mass sensor configured to measure the mass of the substrate. The system includes a controller communicatively coupled to the dual interferometer sub-system and the mass sensor. The controller includes one or more processors. The one or more processors are configured to execute a set of program instructions stored in memory, the set of program instructions configured to cause the one or more processors to determine a thickness distribution of at least one of the substrate or a film deposited on the substrate as a function of position across the substrate based on one or more flatness measurements from the dual interferometer sub-system and one or more mass measurements from the mass sensor.

18 Claims, 8 Drawing Sheets

(56) References Cited

U.S. PATENT DOCUMENTS

| | | | |
|---|---|---|---|
| 6,513,451 B2* | 2/2003 | Van Slyke | C23C 14/12 |
| | | | 118/719 |
| 6,753,972 B1 | 6/2004 | Hirose et al. | |
| 6,806,966 B1 | 10/2004 | Mueller et al. | |
| 6,847,458 B2* | 1/2005 | Freischlad | G01B 11/06 |
| | | | 356/503 |
| 7,020,577 B2 | 3/2006 | Wilby | |
| 7,057,741 B1 | 6/2006 | Mueller et al. | |
| 7,130,039 B2 | 10/2006 | Vaez-Iravani et al. | |
| 7,173,715 B2 | 2/2007 | Mueller et al. | |
| 7,268,887 B2* | 9/2007 | Kulawiec | G01B 11/06 |
| | | | 356/485 |
| 7,471,396 B2* | 12/2008 | Jansen | G01B 11/06 |
| | | | 356/492 |
| 7,492,451 B2 | 2/2009 | Vaez-Lravani et al. | |
| 7,505,144 B2 | 3/2009 | Mueller et al. | |
| 7,847,954 B2* | 12/2010 | Tang | G01B 11/06 |
| | | | 356/503 |
| 8,068,234 B2 | 11/2011 | Tang et al. | |
| 8,786,842 B2 | 7/2014 | Muller et al. | |
| 8,817,248 B2 | 8/2014 | Vaez-Lravani et al. | |
| 9,273,952 B2 | 3/2016 | Mueller et al. | |
| 9,349,624 B2 | 5/2016 | Wilby | |
| 9,714,825 B2* | 7/2017 | Marx | G01B 11/2441 |
| 2002/0142493 A1 | 10/2002 | Halliyal et al. | |
| 2007/0148792 A1 | 6/2007 | Marx et al. | |
| 2009/0277584 A1 | 11/2009 | Hudson et al. | |
| 2012/0257207 A1 | 10/2012 | Marx et al. | |
| 2014/0293291 A1 | 10/2014 | Tang | |
| 2016/0146590 A1 | 5/2016 | Chen et al. | |
| 2016/0153769 A1 | 6/2016 | Pareschi | |

OTHER PUBLICATIONS

Klaus Freischlad et al., "Interferometry for Wafer Dimensional Metrology", Proc. SPIE 6672, 1 (2007).

International Search Report and Written Opinion dated May 24, 2018 for PCT/US2018/017255.

* cited by examiner

SYSTEM AND METHOD FOR MEASURING SUBSTRATE AND FILM THICKNESS DISTRIBUTION

CROSS-REFERENCE TO RELATED APPLICATION

The present application claims the benefit under 35 U.S.C. § 119(e) of U.S. Provisional Application Ser. No. 62/456,651, filed Feb. 8, 2017, entitled METHOD TO USE MASS GAUGE IN WSPWG FOR WAFER AND FILM THICKNESS DISTRIBUTION MEASUREMENT, naming Dengpeng Chen and Andrew Zeng as inventors, which is incorporated herein by reference in the entirety.

TECHNICAL FIELD

The present disclosure relates to the measurement of substrate and film thickness, and, in particular, to the utilization of a mass gauge and measurements from a dual interferometer to determine substrate or film thickness distribution.

BACKGROUND

Interferometry is a useful technique for measuring one or more spatial characteristics of a sample, such as a semiconductor wafer or any other semiconductor or non-semiconductor substrate, based on information associated with illumination reflected from test surfaces of the sample. As semiconductor fabrication continually requires higher levels of accuracy and precision, improved interferometry techniques are needed to meet the demands of modern fabrication technologies. Measurements of the absolute thickness distribution $t(x,y)$ of a wafer or a thin film is often desired. Currently, the measurement of the absolute thickness distribution $t(x,y)$ of a bare wafer is accomplished through the combination of dual interferometry measurements and capacitance gauge (CG) or optical thickness gauge (OTG) measurements, which are performed across the wafer. CG measurements involve the use of capacitive displacement sensors, which can only be used to measure substrates that can be virtually grounded. OTG measurements involve the use of laser displacement sensors and can only sense a material surface if it is reflective of the incident laser beam. Both of these approaches suffer from significant limitations. Therefore, it is desirable to provide a system and method that overcomes the shortfalls of the previous approaches discussed above.

SUMMARY

A system for measuring substrate and/or film thickness is disclosed, in accordance with one or more embodiments of the present disclosure. In one embodiment, the system includes a dual interferometer sub-system configured to measure flatness across a substrate. In another embodiment, the system includes a mass sensor configured to measure the mass of the substrate. In another embodiment, the system includes a controller communicatively coupled to the dual interferometer sub-system and the mass sensor. In another embodiment, the controller includes one or more processors, wherein the one or more processors are configured to execute a set of program instructions stored in memory. In another embodiment, the set of program instructions is configured to cause the one or more processors to determine a thickness distribution of at least one of the substrate or a film deposited on the substrate as a function of position across the substrate based on one or more flatness measurements from the dual interferometer sub-system and one or more mass measurements from the mass sensor.

A method for measuring substrate thickness is disclosed, in accordance with one or more embodiments of the present disclosure. In one embodiment, the method acquires one or more flatness measurements of a substrate as a function of position across the substrate. In another embodiment, the method acquires one or more mass measurements of the substrate. In another embodiment, the method determines an average thickness of the substrate based on the one or more mass measurements. In another embodiment, the method determines one or more thickness distributions of the substrate as a function of position across the substrate based on the one or more flatness measurements and the average thickness of the substrate. In another embodiment, the method adjusts one or more process tools based on the determined one or more thickness distributions of the substrate.

A method for measuring film thickness is disclosed, in accordance with one or more embodiments of the present disclosure. In one embodiment, the method acquires a first flatness measurement and a first mass measurement of a substrate prior to deposition of a film on the substrate. In another embodiment, the method determines an average thickness of the substrate based on the one or more mass measurements prior to deposition of the film on the substrate. In another embodiment, the method acquires a second flatness measurement and a second mass measurement of the substrate following deposition of the film on the substrate. In another embodiment, the method determines an average thickness of the substrate based on the one or more mass measurements following deposition of the film on the substrate. In another embodiment, the method determines a thickness distribution of the film as a function of position across the substrate based on the first flatness measurement and the first average thickness prior to deposition of the film and the second flatness measurement and the second average thickness of the substrate following deposition of the film on the substrate. In another embodiment, the method adjusts one or more process tools based on the determined thickness distribution of the film.

A method for measuring film thickness for a film disposed on one or more pre-layers is disclosed, in accordance with one or more embodiments of the present disclosure. In one embodiment, the method receives a first flatness measurement and a first mass measurement of a substrate prior to deposition of a film on the substrate and following deposition of one or more pre-layers on the substrate. In another embodiment, the method receives a second flatness measurement and a second mass measurement of the substrate following deposition of the film onto the pre-layers of the substrate. In another embodiment, the method determines the thickness of the film as a function of position across the substrate based on the density of the film, the first flatness measurement, the first mass of the substrate, the second flatness measurement, and the second mass of the substrate.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

FIGS. 1 through 6 illustrate a system and method for measuring thickness distributions of a substrate or film, in accordance with one or more embodiments of the present disclosure. Embodiments of the present disclosure are directed to the utilization of one or more mass measurement results of a substrate to determine a thickness distribution associated with the substrate. Embodiments of the present disclosure are also directed to the utilization of one or more mass measurement results of a substrate to determine a thickness distribution associated with a film (e.g., metallic film or dielectric film) deposited on the substrate. Films suitable for this measurement process include, but are not limited to, silicon films (e.g., epitaxially grown silicon films), carbon films (e.g., carbon hard masks), tungsten films, photoresist, oxide films, nitride films, and poly layers (e.g., polysilicon layers). Embodiments of the present disclosure are also directed to the utilization of one or more mass measurement results of a substrate having one or more pre-layers (e.g., metallic or dielectric pre-layers) formed thereon to determine a thickness distribution associated with a film deposited on the substrate.

The one or more embodiments of the present disclosure are particularly advantageous as they do not require knowledge of certain material properties of the film and substrate, such as, but not limited to, film transparency, conductivity, etc. Further, the one or more embodiments of the present disclosure are suited for application on metal and dielectric films (e.g., transparent or opaque films).

Figure 1:
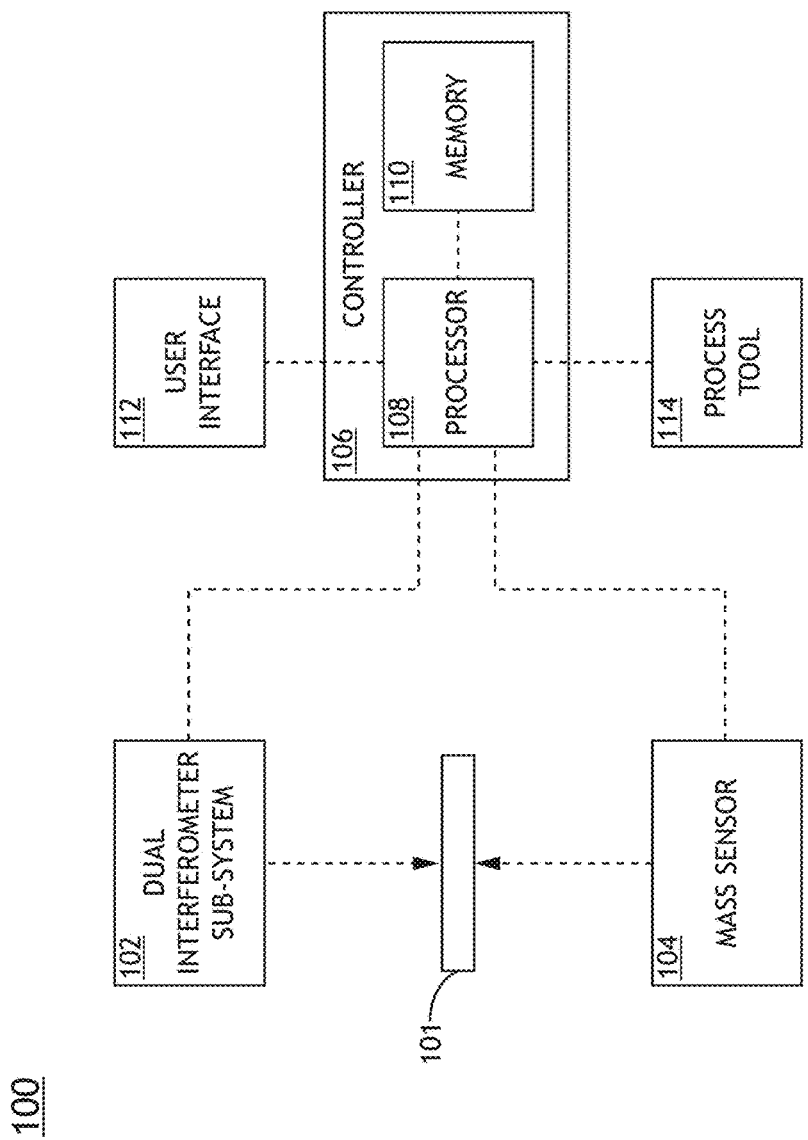
FIG. 1 is a block diagram view of a system for measuring a thickness distribution of a substrate or film, in accordance with one or more embodiments of the present disclosure.

FIG. 1 illustrates a conceptual view of system 100 for measuring the thickness distribution of a substrate or film across the substrate, in accordance with one or more embodiments of the present disclosure.

In one embodiment, the system 100 includes a dual interferometer sub-system 102 (or dual interferometer tool), a mass sensor 104, and a controller 106. In one embodiment, the dual interferometer sub-system 102 is configured to measure flatness across a substrate 101. In another embodiment, the mass sensor 104 is configured to measure the mass of the substrate 101. The substrate 101 may include any substrate known in the art including, but not limited to, a semiconductor wafer (e.g., silicon wafer). The substrate may be coated with one or more films and may include one or more pre-layers, as discussed in additional detail further herein.

In another embodiment, the controller 106 includes one or more processors 108 and memory 110. For example, the memory 110 may maintain program instructions configured to cause the one or more processors 108 to carry out any of the one or more process steps described throughout the present disclosure.

In one embodiment, the one or more processors 108 of the controller 106 are communicatively coupled to the dual interferometer sub-system 102 and the mass sensor 104. In this regard, the one or more processors 108 are configured to receive measurement results from the dual interferometer sub-system 102 and the mass sensor 104. In one embodiment, the one or more processors are configured to determine a thickness distribution of the substrate 101 as a function of position across the substrate 101 based on one or more flatness measurements received from the dual interferometer sub-system and one or more mass measurements received from the mass sensor 104. It is noted that the system 100 may be used to measure the thickness distribution of a substrate and/or the thickness distribution of a thin film deposited on a substrate with or without pre-layers, which is described in additional detail further herein.

The mass sensor 104 may include any mass/weight sensor known in the art capable of measuring the mass of a substrate, such as, but not limited to, a semiconductor wafer. For example, the mass sensor 104 may include, but is not limited to, a high-precision weighing sensor having a precision between 0.1 and 0.3 mg.

The dual interferometer sub-system 102 may include any dual interferometer tool known in the art capable of measuring flatness across a substrate 101. For example, the dual interferometer sub-system 102 may include, but is not limited to, a dual wavelength dual Fizeau interferometer (DWDFI). The dual interferometer sub-system 102 system may be configured to measure any number of spatial characteristics of a substrate 101, such as, but not limited to, shape variation, thickness variation, and/or other spatial parameter variations of the sample. In another embodiment, the dual interferometer sub-system 102 system may be adapted to perform patterned wafer geometry (PWG) measurements on a sample, whereby the dynamic range of the sample slope (e.g., wafer slope) measured by the dual interferometer sub-system 102 is extended by stitching different regions of the sample (e.g., wafer) measurement results together.

A description of a dual wavelength dual interferometer is described in U.S. Pat. No. 6,847,458, issued on Jan. 25, 2005, which is incorporated herein by reference in the entirety. A description of a dual wavelength dual interferometer is described in U.S. Pat. No. 8,068,234, issued on Nov. 29, 2011, which is incorporated herein by reference in the entirety. A description of a dual wavelength dual interferometer is described in U.S. Patent Publication No. 2014/0293291, published on Oct. 2, 2014, which is incorporated herein by reference in the entirety. A description of a dual wavelength dual interferometer used to measure shape and thickness of high slope samples is described in U.S. Pat. No. 7,847,954, issued on Dec. 7, 2010, which is incorporated herein by reference in the entirety. It is recognized herein that the present disclosure may be extended to any phase-shifting interferometry system configured to utilize a wavelength-tunable illumination source for phase shifting. Accordingly, the following description of the dual interferometer sub-system 102 is not intended to limit the present disclosure in any way.

Figure 2A:
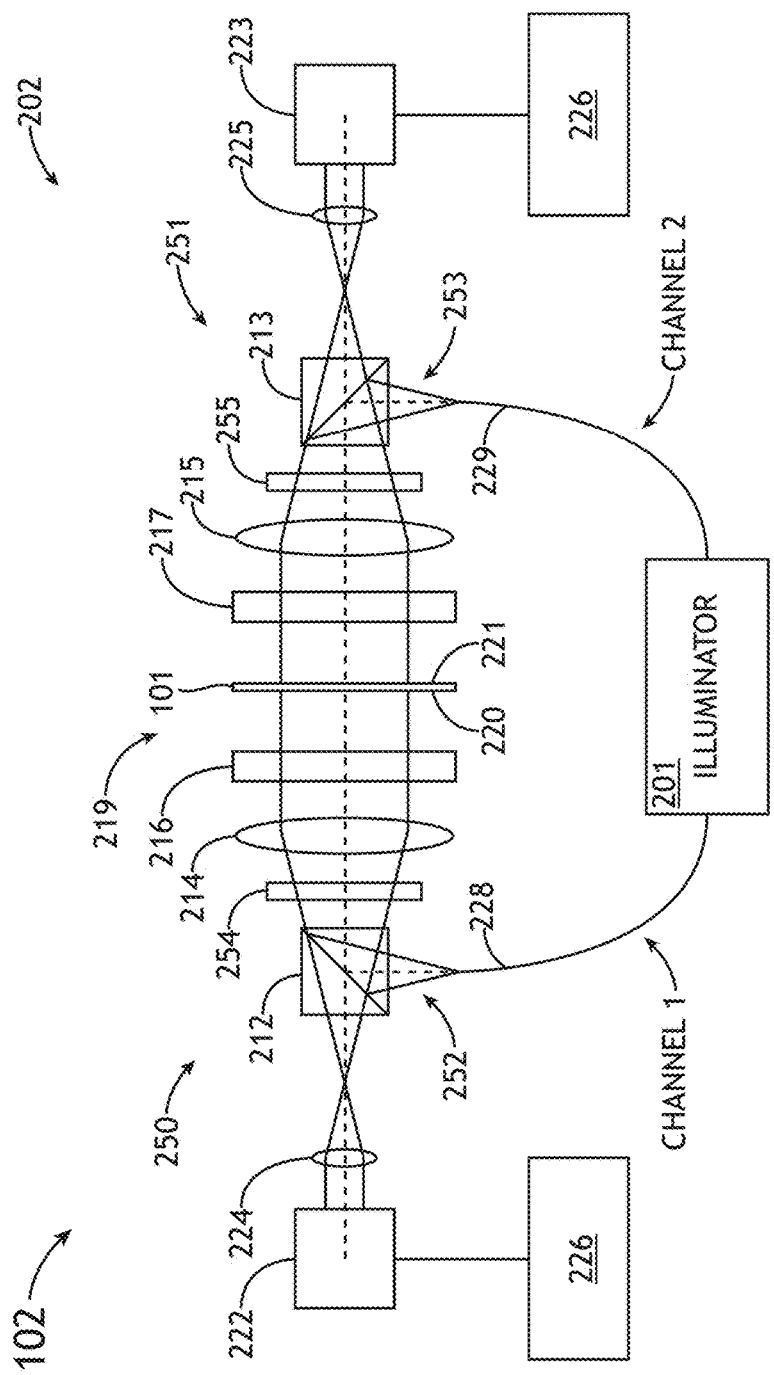
FIG. 2A is a simplified schematic view of a dual interferometer sub-system, in accordance with one or more embodiments of the present disclosure.

FIG. 2A illustrates a simplified schematic view of a dual interferometer sub-system 102, in accordance with one or more embodiments of the present disclosure.

In one embodiment, the sub-system 102 of system 100 includes two interferometers 250 and 251. In one embodiment, the sub-system 102 includes an illumination source or illuminator 201, which is configured to provide light along Channel 1 and Channel 2 to the interferometers 250 and 251.

In another embodiment, the optical Channels 1 and 2 of the sub-system 102 include optical fibers 228 and 229 configured to transmit the light from the illumination source 201 to the interferometer inputs 252 and 253. In one embodiment, the interferometer inputs 252 and 253 include one or more optical elements connected in series with the one or more optical fibers 228 and 229. In another embodiment, the interferometer inputs 252 and 253 may include the optical fibers 228 and 229. The interferometer inputs 252 and 253 may direct at least a portion of the light from the illuminator 201 to the phase-shifting interferometers 250 and 251.

In one embodiment, the interferometers 250 and 251 each include one or more polarizing beam splitters 212, 213 configured to receive light from the interferometer inputs 252, 253. In another embodiment, the beam splitters 212, 213 direct a portion of the light to quarter-wave plates 254, 255. Light passing through the polarizing beam splitters 212, 213 and through the quarter-wave plates 254 and 255 may be circularly polarized. The circularly polarized light may then be received by lenses 214, 215 configured to collimate the light into beams having a diameter greater than a diameter of the substrate 101. The one or more lenses 214, 215 may also direct the collimated beams to reference flats 216, 217 (e.g., parallel reference flats). The substrate 101 may be positioned in the center of the cavity 219 defined by the reference flats 216, 217. In another embodiment, the collimated beams may be transmitted through the reference flats 216, 217 to substrate 101.

In another embodiment, a first portion of each of the transmitted beams is directed to one or more surfaces 220, 221 of the substrate 101. Further, a second a portion of each of the transmitted beams is directed to the reference surfaces of the reference flats 216, 217 located opposite to the one or more transmitting reference flats 216, 217.

In another embodiment, the sub-system 102 includes detectors 222, 223. The detectors 222, 223 may include, but are not limited to, one or more CCD detectors, one or more TDI-CCD detectors, one or more CMOS detectors, or any other photodetectors known in the art. In one embodiment, the detectors 222, 223 may be configured to detect via lenses 224, 225 portions of illumination reflected from the one or more surfaces 220, 221 of the substrate 101. In another embodiment, the detectors 222, 223 are configured to detect portions of light reflected from corresponding reference surfaces of reference flats 216, 217. In another embodiment, the sub-system 102 includes one or more controllers 226 communicatively coupled to the detectors 222, 223. In another embodiment, the one or more controllers 226 acquire information associated with detected light from the detectors 222, 223. In another embodiment, the controllers 226 may execute a measurement algorithm from program instructions stored on memory to determine one or more spatial characteristics of the substrate 101 based on measurements from the substrate 101. Measurement algorithms for determining spatial characteristics of samples with phase-shifting interferometry systems are known in the art. It is noted that any measurement process known in the art may be implemented with sub-system 102 and the one or more controllers 226. Further, the one or more controllers 226 depicted in FIG. 2A may be embodied in controller 106, shown in FIG. 1, and vice-versa.

Figure 2B:
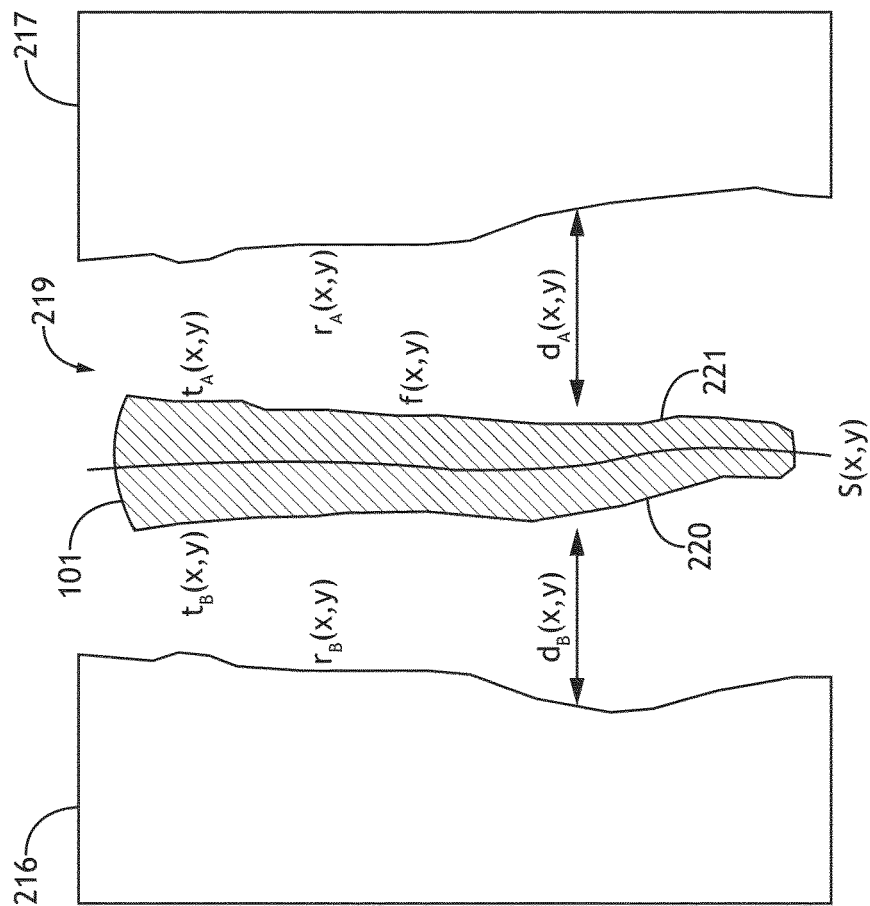
FIG. 2B is a simplified schematic view of a cavity of a dual interferometer sub-system, in accordance with one or more embodiments of the present disclosure.

FIG. 2B illustrates a conceptual view of a Dual Fizeau cavity 219, in accordance with one or more embodiments of the present disclosure. As shown in FIG. 2B, the Dual Fizeau cavity 219 may be configured to hold substrate 101 in a substantially vertical position. For instance, the Dual Fizeau cavity 219 many include a set of point contact devices (not shown) configured to receive and hold the wafer in a substantially upright position in a substantially free state. Utilizing the two reference flats 216 and 217, which serve as the reference surfaces for the interferometer, the Dual Fizeau interferometer may analyze various parameters associated with the substrate and its spatial relationship to the reference flats 216 and 217.

The dual interferometer sub-system 102 may simultaneously measure thickness variations of both the front-side 220 surface and back-side surface 221 of the substrate 101. The shape value at each of the measured points of the front-side and/or back-side surface may then be calculated utilizing the measured height variation at those points. The shape $s(x,y)$ of the wafer as a function of X-Y position on the surface of the wafer may be expressed as a function of the cavity distance between the surfaces of the substrate 101 and the corresponding reference flats 216, 217.

In this case, $d_A(x,y)$ represents the cavity distance between the first reference flat 217 of cavity 219 and a first side 221 (e.g., front-side) of the substrate, $d_B(x,y)$ represents the cavity distance between the second reference flat 216 and a second side 220 (e.g., back-side) of the wafer. In this regard, the cavity distance $d_A(x,y)$ variation is related to the difference between the thickness $t_A(x,y)$ variation of the first side of the substrate and the variation of the surface of the reference flat $r_A(x,y)$. Similarly, the cavity distance $d_B(x,y)$ variation is related to the difference between the thickness $t_B(x,y)$ variation of the second side of the substrate and the variation of the surface of the reference flat $r_B(x,y)$.

Utilizing these relationships a two-dimensional X-Y map of shape may be constructed by calculating shape at a plurality of positions on the substrate. Dual Fizeau interferometry suitable for measuring front-side and back-side topography of a substrate (e.g., semiconductor wafer) is described in detail in Klaus Freischlad et al., "*Interferometry for Wafer Dimensional Metrology*", Proc. SPIE 6672, 1 (2007), which is incorporated herein by reference in the entirety. In addition, Dual sided interferometry is described generally in U.S. Pat. No. 6,847,458, issued on Jan. 25, 2005; U.S. Pat. No. 8,068,234, issued on Nov. 29, 2011, which are both incorporated herein by reference in the entirety.

In one embodiment, the one or more processors 108 of the controller 106 of system 100 may determine a thickness distribution of the substrate 101 as a function of position across the substrate 101 based on one or more flatness measurements from the dual interferometer sub-system 102 and one or more mass measurements from the mass sensor 104. In one embodiment, the one or more processors 108 receive one or more flatness measurements $f(x,y)$ of the substrate 101 as a function of X-Y position across the substrate 101 from the dual interferometer sub-system 102. In another embodiment, the one or more processors 108 receive one or more mass measurements m of the substrate from the mass sensor 104. In another embodiment, the one or more processors 108 determine an average thickness of the substrate 101 based on the one or more mass measurements. In another embodiment, the one or more processors 108 determine the thickness distribution t(x,y) of the substrate 101 as a function of position across the substrate 101 based on the one or more flatness measurements and the average thickness of the substrate 101.

It is noted that to obtain the thickness as a function of X-Y position across the substrate 101 a thickness reference constant may be implemented. The interferometer sub-system 102 cannot provide this reference due to nλ phase ambiguity. Thickness across the substrate 101 may be expressed in terms of the flatness of the substrate 101 as follows:

$$t(x,y)=f(x,y)+K \qquad \text{Eq. 1}$$

where t(x,y) represents the thickness distribution across the substrate as a function of X,Y position, f(x,y) represents the flatness of the substrate as a function of X-Y position, and K represents the reference constant.

It is noted that the mass sensor 104 may provide average thickness information, where the average thickness, $t_{ave}$, is given by:

$$t_{ave} = \frac{w}{\rho A} \qquad \text{Eq. 2}$$

where w is the weight (or mass) of the wafer measured using the mass sensor 104, ρ is the material density of the substrate 101 and A is the area of the substrate 101. The average thickness is expressed in terms of the flatness and the constant K as follows:

$$t_{ave} = \frac{1}{A}\int t(x,y)dA = \frac{1}{A}\int [f(x,y)+K]dA \qquad \text{Eq. 3}$$

if the average thickness $t_{ave}$ is known then Eq. 3 can be rearranged to provide a solution for K as follows:

$$K = t_{ave} - \frac{1}{A}\int [f(x,y)]dA \qquad \text{Eq. 4}$$

Then, based on Eq. 1 and Eq. 4, the one or more processors 108 may determine the thickness distribution t(x,y) of the substrate 101 as a function of X-Y position.

Figure 3A:
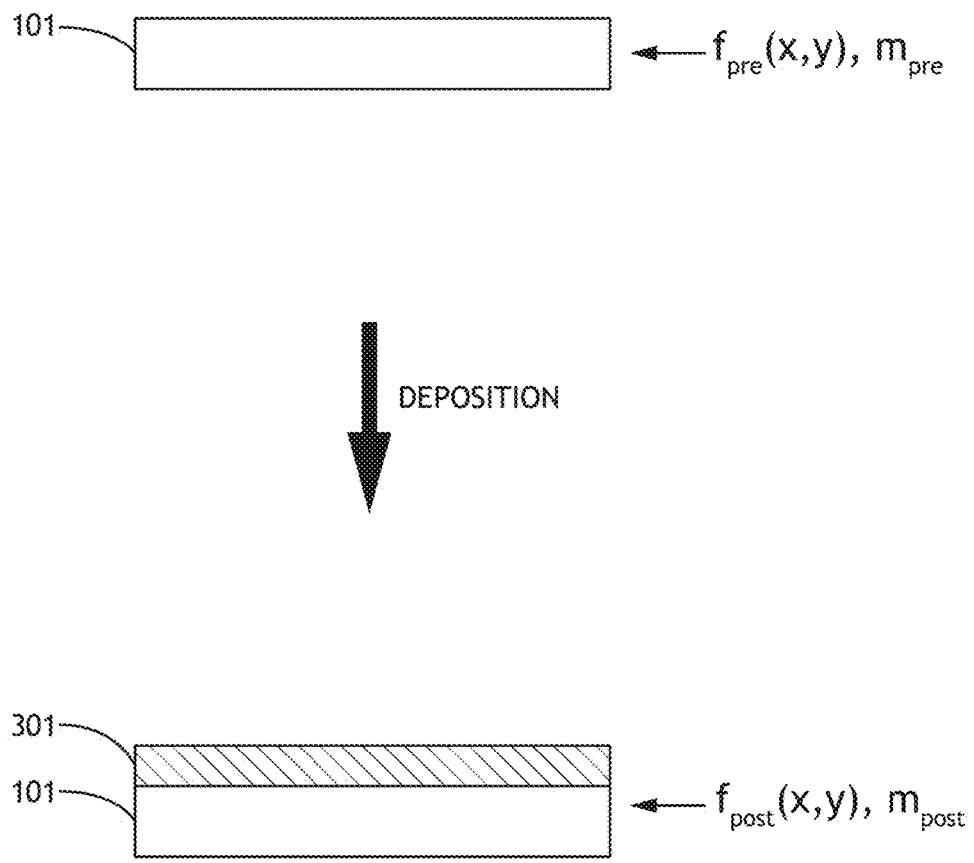
FIG. 3A is a conceptual view of a film/coating deposition process on a substrate, in accordance with one or more embodiments of the present disclosure.

In another embodiment, the one or more processors 108 of the controller 106 of the system 100 may determine a thickness of a film as a function of position across the substrate 101 based on two or more flatness measurements of the substrate 101 and two or more mass measurements of the substrate 101. For example, as shown in FIG. 3A, a first flatness measurement $f_{pre}$(x,y) and a first mass measurement $m_{pre}$ of the substrate 101 may be performed prior to the deposition of a film 301. Then, following the deposition of the film 301, a second flatness measurement $f_{post}$(x, y) and a second mass measurement $m_{post}$ may be performed on the substrate 101. Based on the set of flatness measurements $f_{pre}$(x,y) and $f_{post}$(x, y) and the set of mass measurements $m_{pre}$, $m_{post}$, the one or more processors 108 may determine the thickness distribution of the deposited film 301. In one embodiment, the one or more processors 108 receive a first flatness measurement $f_{pre}$(x,y) and a first mass $m_{pre}$ measurement of the substrate 101 prior to deposition of the film 301 on the substrate 101. In another embodiment, prior to deposition of the film 301 on the substrate 101, the one or more processors 108 determine an average thickness of the substrate 101 based on the first mass measurement $m_{pre}$. In another embodiment, following deposition of the film 301 on the substrate 101, the one or more processors 108 receive a second flatness measurement $f_{post}$(x, y) and a second mass measurement $m_{post}$ of the substrate 101 (i.e., substrate and film). In another embodiment, the one or more processors 108 determine a second average thickness of the substrate 101 based on the second mass measurement $m_{post}$ following deposition of the film on the substrate 101. In another embodiment, the one or more processors 108 determine the thickness of the film $t_{film}$(x,y) as a function of position across the substrate 301 based on the first flatness measurement $f_{pre}$(x,y) and the first average thickness prior to deposition of the film 301 and the second flatness measurement $f_{post}$(x,y) and the second average thickness of the substrate 301 following deposition of the film 301 onto the substrate.

The thickness distribution of the film as a function of X-Y position may be expressed as follows:

$$t_{film}(x,y) = t_{post}(x,y) - t_{pre}(x,y) = f_{post}(x,y) - f_{pre}(x,y) + K_{post} - K_{pre} \qquad \text{Eq. 5}$$

where the constants $K_{post}$ and $K_{pre}$ are given by:

$$K_{post} = t_{ave\_post} - \frac{1}{A}\int f_{post}(x,y)dA \qquad \text{Eq. 6}$$

$$K_{pre} = t_{ave\_pre} - \frac{1}{A}\int f_{pre}(x,y)dA \qquad \text{Eq. 7}$$

Then, based on Eq. 5, Eq. 6 and Eq. 7, the one or more processors 108 may determine the thickness distribution of the film 301 $t_{film}$(x,y) as a function of X-Y position across the substrate 101.

In another embodiment, the one or more processors 108 of the controller 106 of the system 100 may determine a thickness of a film as a function of position across the substrate 101 in the case where one or more pre-layers are deposited on the substrate 101 prior to deposition of the film 301. It is noted that in many semiconductor fabrication settings one or more pre-layers are deposited on the substrate prior to the deposition of a thin film/coating of interest. In one embodiment, the system 100 may determine the thickness of the deposited film 301 utilizing the density of the film 301. In this regard, the thickness of the film 301 may be determined without knowledge of the material or density of the one or more pre-layers deposited prior to the film 301.

It is noted that the average thicknesses of the film 301 prior to deposition and after deposition may be express as:

$$t_{ave\_post} - t_{ave\_pre} = t_{ave\_film} = \frac{m_{post} - m_{pre}}{\rho_{film} A} \qquad \text{Eq. 8}$$

where and $m_{pre}$ and $m_{post}$ are the mass of the substrate 101 before and after deposition of the film 301, $\rho_{film}$ is the density of the film of interest 301, and A is the area of the substrate 101. Eq. 8 may be rewritten in terms of flatness to provide:

$$t_{film}(x, y) = f_{post}(x, y) - f_{pre}(x, y) + \qquad \text{Eq. 9}$$
$$\frac{w_{post} - w_{pre}}{\rho_{film} A} - \frac{1}{A} \int [f_{post}(x, y) - f_{pre}(x, y)] dA$$

Figure 3B:
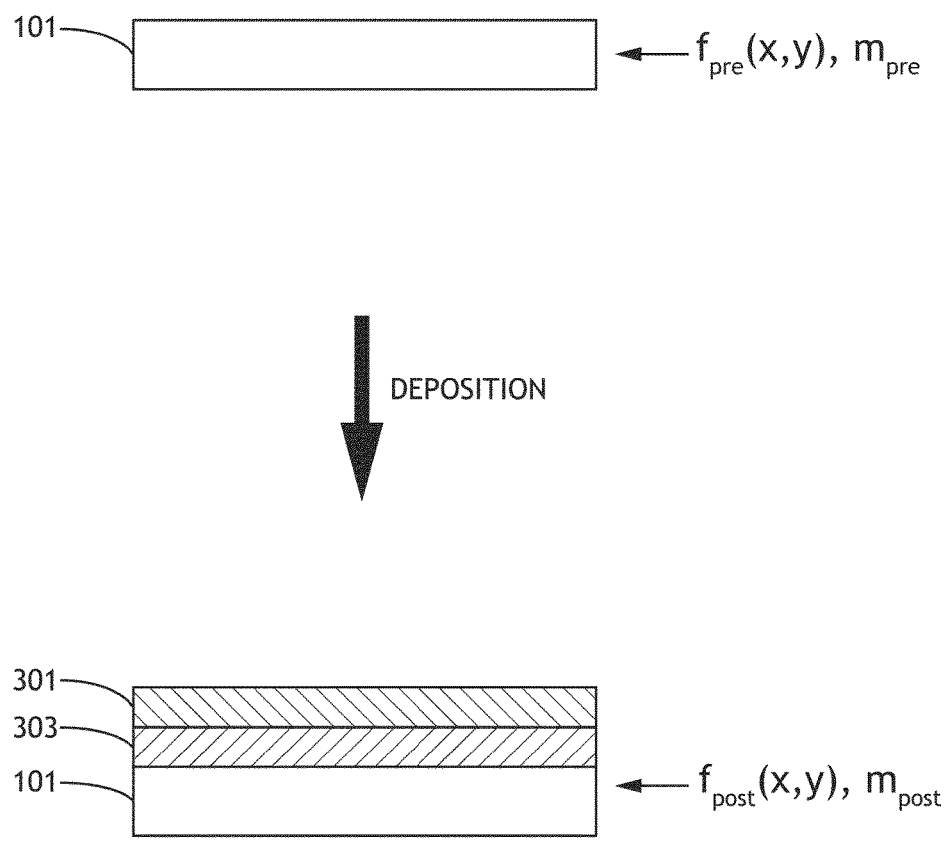
FIG. 3B is a conceptual view of a film deposition process on a substrate having one or more pre-layers, in accordance with one or more embodiments of the present disclosure.

As shown in FIG. 3B, one or more pre-layers 303 may be deposited onto a surface of the substrate 101 prior to the deposition of the film of interest 301. In one embodiment, a first flatness measurement $f_{pre}(x,y)$ and a first mass measurement $m_{pre}$ of the substrate 101 may be performed prior to the deposition of a film 301. Then, following the deposition of the film 301 onto the one more pre-layers 303, a second flatness measurement $f_{post}(x,y)$ and a second mass measurement $m_{post}$ may be performed on the substrate 101. Based on the density $\rho_{film}$ of the film of interest, the set of flatness measurements $f_{pre}(x, y)$ and $f_{post}(x, y)$ and the set of mass measurements $m_{pre}$, $m_{post}$, the one or more processors 108 may determine the thickness distribution of the deposited film 301.

In one embodiment, the one or more processors 108 receive a first flatness measurement $f_{pre}(x, y)$ and a first mass measurement $m_{pre}$ of a substrate 101 prior to deposition of a film 301 on the substrate 101 and following deposition of one or more pre-layers 303 on the substrate 101. In another embodiment, the one or more processors 108 receive a second flatness measurement $f_{post}(x,y)$ and a second mass measurement $m_{post}$ of the substrate 101 following deposition of the film 301 onto the pre-layers 303 of the substrate 101. In another embodiment, the one or more processors 108 determine the thickness of the film 301 as a function of position across the substrate 101 based on the density $\rho_{film}$ of the film 301, the first flatness measurement $f_{pre}(x, y)$, the first mass $m_{pre}$ of the substrate 101, the second flatness measurement $f_{post}(x,y)$, and the second mass $m_{post}$ of the substrate 101 (e.g., see Eq. 9).

It is noted herein that in settings where multiple layers coatings have been applied to a substrate the thickness of a whole substrate is approximate because a common material density is assumed (e.g., density of Si). In contrast, the thickness measurement for a film of interest will provide better results because, as observed in Eq. 9, the film thickness does not require knowledge of the density of the pre-layer material.

In another embodiment, the system 100 includes a user interface device 112 communicatively coupled to the one or more processors 108 of controller 106. The user interface device 112 may be utilized by controller 106 to accept information, selections and/or instructions from a user. For example, a display may be used to display data or a prompt to a user (not shown). In turn, a user may input information, a selection and/or instructions into the memory 110 of the controller 106 via the user interface device 112.

While the foregoing description has focused on a mass sensor 104 placed in communication with the one or more processors 108, such a configuration is not a limitation on the scope of the embodiments of the present disclosure. In an alternative embodiment, the mass information discussed previously herein may be entered into the memory 110 of the controller 106 by a user via user interface 112. In this regard, the various thickness distribution calculations described previously herein may be carried out with the mass information entered into memory 110 via user interface 112.

In one embodiment, upon determining a thickness distribution for the substrate 101 and/or the film 301, the one or more processors 108 may transmit one or more control/adjust instructions to one or more process tools 114. For example, in response to determining a thickness distribution for the substrate 101 and/or the film 301 that deviates from a preferred thickness distribution, the one or more processors 108 may adjust one or more parameters of a process tool 114 along a semiconductor fabrication facility in order to mitigate observed deficiencies associated with the substrate, film, and/or final semiconductor device. In this regard, the one or more processors 108 may provide feedback information to upstream process tools 114 to adjust process conditions for subsequent substrates, which follow the initial substrate along the semiconductor fabrication line. Further, the one or more processors 108 may provide feedforward information to downstream process tools 114 to adjust process conditions for the substrate in question as it progresses along the semiconductor fabrication line.

The one or more processors 108 of controller 106 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 110. Moreover, different subsystems of the system 100 (e.g., dual interferometer sub-system/tool 102, mass sensor 104, or user interface 112) may include a processor or logic elements suitable for carrying out at least a portion of the steps described throughout the present disclosure.

The memory medium 110 may include any memory medium known in the art suitable for storing program instructions executable by the associated one or more processors 108. For example, the memory medium 110 may include, but is not limited to, a read-only memory, a random access memory, a magnetic or optical memory device (e.g., disk), a magnetic tape, a solid state drive and the like. In another embodiment, the memory medium 110 is configured to store one or more results from the dual interferometer sub-system 102 and/or the mass sensor 104 and/or the output of the various data processing steps described herein. It is further noted that memory medium 110 may be housed in a common controller housing with the one or more processors 108. In an alternative embodiment, the memory medium 110 may be located remotely with respect to the physical location of the processors and controller 106. For instance, the one or more processors 108 of controller 106 may access a remote memory (e.g., server), accessible through a network (e.g., internet, intranet and the like).

It is further noted that, while FIG. 1 depicts the controller 106 as being embodied separately from the dual interferometer sub-system 102 and mass sensor 104, such a configuration of system 100 is not a limitation on the scope of the present disclosure, but is provided merely for illustrative purposes. For example, the controller 106 may be embodied in a controller of the dual interferometer sub-system 102 and/or the mass sensor 104.

The user interface device 112 may include any user interface known in the art. For example, the user interface 112 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like.

Figure 4:
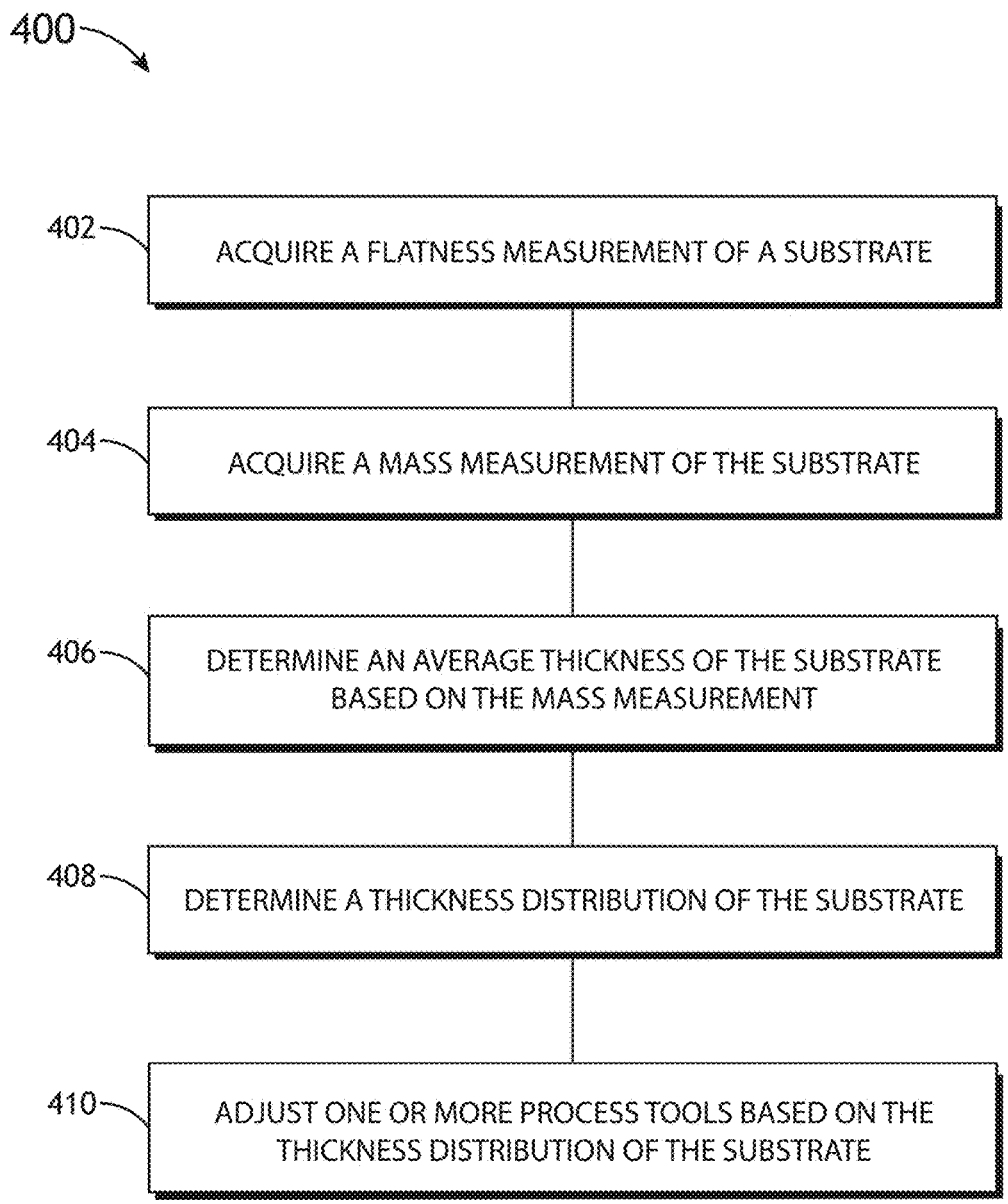
FIG. 4 illustrates a process flow diagram depicting a method for measuring a thickness distribution of a substrate, in accordance with one or more embodiments of the present disclosure.

FIG. 4 illustrates a process flow diagram depicting a method 400 for measuring a thickness distribution of a substrate, in accordance with one or more embodiments of the present disclosure. In step 402, one or more flatness measurements of a substrate are acquired as a function of position across the substrate 101. In step 404, one or more mass measurements of the substrate 101 are acquired. In step 406, an average thickness of the substrate 101 is determined based on the one or more mass measurements. In step 408, one or more thickness distributions of the substrate as a function of position across the substrate are determined based on the one or more flatness measurements and the average thickness of the substrate 101. In step 410, one or more process tools are adjusted based on the determined one or more thickness distributions of the substrate 101.

Figure 5:
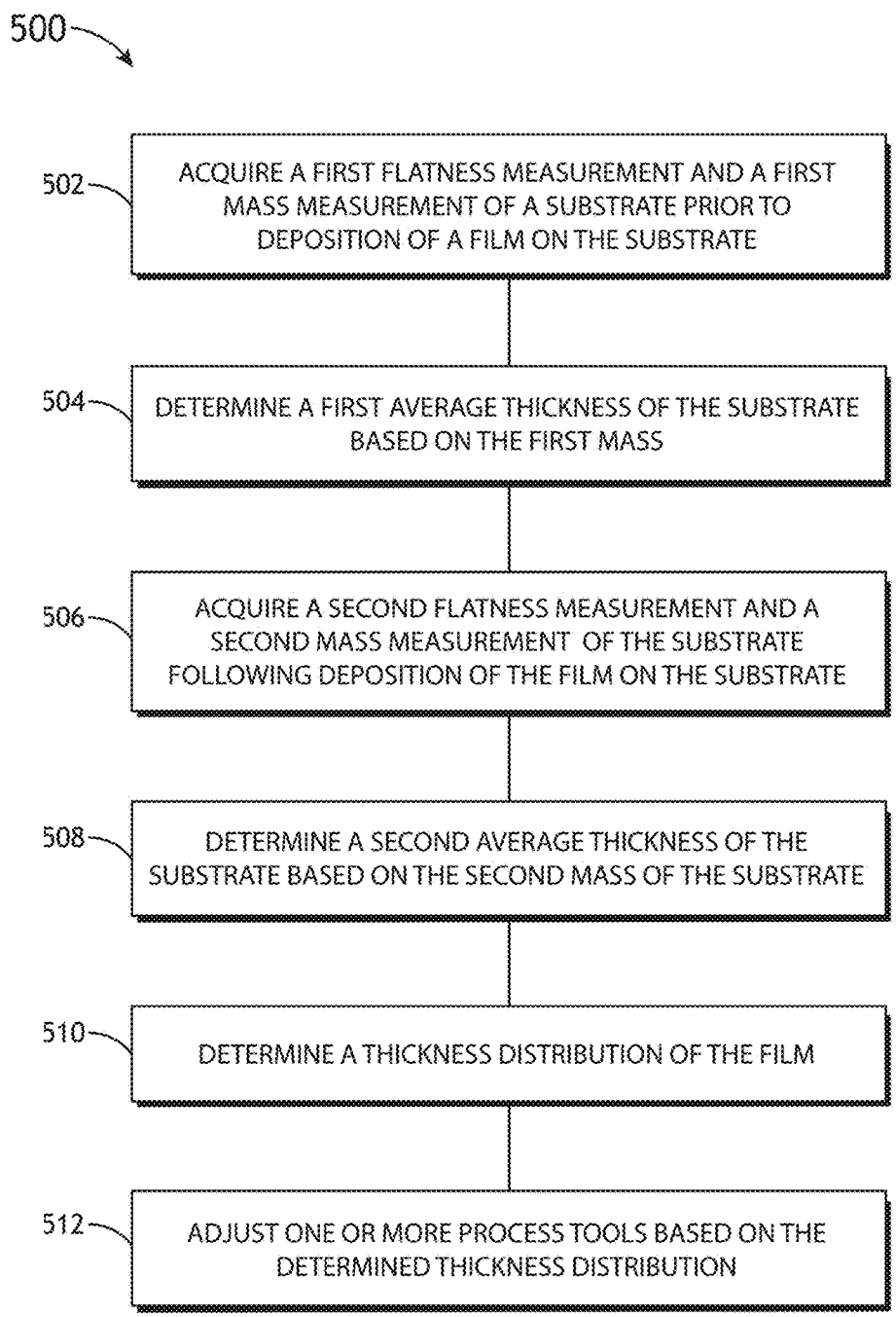
FIG. 5 illustrates a process flow diagram depicting a method for measuring a thickness distribution of a film deposited on a substrate, in accordance with one or more embodiments of the present disclosure.

FIG. 5 illustrates a process flow diagram depicting a method 500 for measuring a thickness distribution of a film deposited on a substrate, in accordance with one or more embodiments of the present disclosure. In a first step 502, a first flatness measurement and a first mass measurement of a substrate are acquired prior to deposition of a film on the substrate 101. In a second step 504, an average thickness of the substrate is determined based on the one or more mass measurements prior to deposition of the film on the substrate. In step 506, a second flatness measurement and a second mass measurement of the substrate are acquired following deposition of the film on the substrate 101. In step 508, an average thickness of the substrate is determined based on the one or more mass measurements following deposition of the film on the substrate. In step 510, a thickness distribution of the film as a function of position across the substrate is determined based on the first flatness measurement and the first average thickness prior to deposition of the film and the second flatness measurement and the second average thickness of the substrate following deposition of the film 303 on the substrate. In step 512, one or more process tools are adjusted based on the determined thickness distribution of the film 303.

Figure 6:
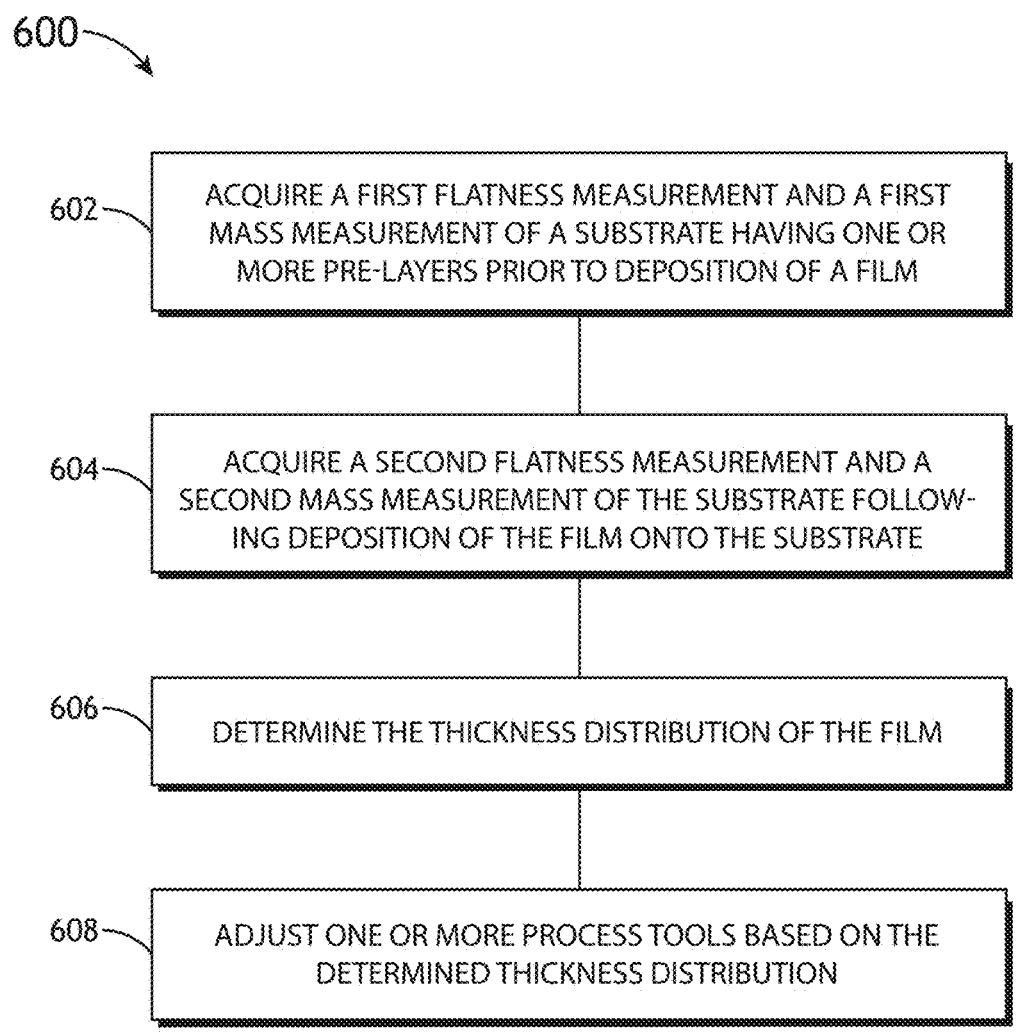
FIG. 6 illustrates a process flow diagram depicting a method for measuring a thickness distribution of a film deposited on a substrate having one or more pre-layers, in accordance with one or more embodiments of the present disclosure.

FIG. 6 illustrates a process flow diagram depicting a method 600 for measuring a thickness distribution of a film deposited on a substrate with one or more preformed pre-layers, in accordance with one or more embodiments of the present disclosure. In step 602, a first flatness measurement and a first mass measurement of a substrate are acquired prior to deposition of a film on the substrate and following deposition of one or more pre-layers on the substrate. In step 604, a second flatness measurement and a second mass measurement of the substrate are acquired following deposition of the film onto the pre-layers of the substrate. In step 606, the thickness of the film as a function of position across the substrate is determined based on the density of the film, the first flatness measurement, the first mass of the substrate, the second flatness measurement, and the second mass of the substrate. In step 608, one or more process tools are adjusted based on the determined thickness distribution of the film 303.

While implementations of methods 400, 500, and 600 are discussed herein, it is further contemplated that various steps of methods 400, 500, and 600 may be included, excluded, rearranged, and/or implemented in many ways without departing from the essence of the present disclosure. Accordingly, the foregoing embodiments and implementations of methods 400, 500, and 600 are included by way of example only and are not intended to limit the present disclosure in any way.

All of the methods described herein may include storing results of one or more steps of the method embodiments in a memory medium. The results may include any of the results described herein and may be stored in any manner known in the art. The memory medium may include any memory medium described herein or any other suitable memory medium known in the art. After the results have been stored, the results can be accessed in the memory medium and used by any of the method or system embodiments described herein, formatted for display to a user, used by another software module, method, or system, etc. Furthermore, the results may be stored "permanently," "semi-permanently," temporarily," or for some period of time. For example, the memory medium may be random access memory (RAM), and the results may not necessarily persist indefinitely in the memory medium.

It is further contemplated that each of the embodiments of the method described above may include any other step(s) of any other method(s) described herein. In addition, each of the embodiments of the method described above may be performed by any of the systems described herein.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable and/or wirelessly interacting components, and/or logically interacting and/or logically interactable components.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed is:

1. A system comprising:
   a dual interferometer sub-system configured to measure flatness across a substrate; and
   a controller communicatively coupled to the dual interferometer sub-system and a mass sensor, the controller including one or more processors, wherein the one or more processors are configured to execute a set of program instructions stored in memory, the set of program instructions configured to cause the one or more processors to:
   determine a thickness distribution of at least one of the substrate or a film deposited on the substrate as a function of position across the substrate based on one or more flatness measurements from the dual interferometer sub-system and one or more mass measurements; and
   provide one or more control instructions based on the determined thickness distribution of at least one of the substrate or the film to adjust one or more process tools.

2. The system of claim 1, wherein the one or more processors are further configured to:
   receive one or more flatness measurements of the substrate as a function of position across the substrate from the dual interferometer sub-system;
   receive one or more mass measurements of the substrate;
   determine an average thickness of the substrate based on the one or more mass measurements; and
   determine the thickness distribution of the substrate as a function of position across the substrate based on the one or more flatness measurements and the average thickness of the substrate.

3. The system of claim 1, wherein the one or more processors are configured to:
   receive the one or more mass measurements of the substrate from a user via a user interface.

4. The system of claim 1, wherein the one or more processors are configured to:
   receive the one or more mass measurements of the substrate from the memory.

5. The system of claim 1, wherein the dual interferometer sub-system comprises:
   a dual wavelength dual Fizeau interferometer (DWDFI) sub-system.

6. The system of claim 1, wherein the mass sensor comprises:
   a high precision weighing sensor.

7. The system of claim 1, wherein the substrate comprises:
   a semiconductor wafer.

8. The system of claim 1, wherein the one or more processors are further configured to:
   determine a thickness distribution of the film as a function of position across the substrate based on two or more flatness measurements of the substrate and two or more mass measurements of the substrate.

9. The system of claim 8, wherein the one or more processors are further configured to:
   receive a first flatness measurement and a first mass measurement of a substrate prior to deposition of a film on the substrate;
   determine an average thickness of the substrate based on the first mass measurement prior to deposition of the film on the substrate;
   receive a second flatness measurement and a second mass measurement of a substrate following deposition of the film on the substrate;

determine an average thickness of the substrate based on the second mass measurement following deposition of the film on the substrate; and determine the thickness of the film as a function of position across the substrate based on the first flatness measurement and the first average thickness prior to deposition of the film and the second flatness measurement and the second average thickness of the substrate following deposition of the film on the substrate.

10. The system of claim 9, wherein the one or more processors are further configured to:

receive a first flatness measurement and a first mass measurement of a substrate prior to deposition of a film on the substrate and following deposition of one or more pre-layers on the substrate;

receive a second flatness measurement and a second mass measurement of the substrate following deposition of the film onto the pre-layers of the substrate; and determine the thickness of the film as a function of position across the substrate based on the density of the film, the first flatness measurement, the first mass of the substrate, the second flatness measurement and the second mass of the substrate.

11. A system comprising:

a dual interferometer sub-system configured to measure flatness across a substrate;

a mass sensor configured to measure the mass of the substrate; and a controller communicatively coupled to the dual interferometer sub-system and the mass sensor, the controller including one or more processors, wherein the one or more processors are configured to execute a set of program instructions stored in memory, the set of program instructions configured to cause the one or more processors to:

determine a thickness distribution of at least one of the substrate or a film deposited on the substrate as a function of position across the substrate based on one or more flatness measurements from the dual interferometer sub-system and one or more mass measurements from the mass sensor; and provide one or more control instructions based on the determined thickness distribution of at least one of the substrate or the film to adjust one or more process tools.

12. The system of claim 11, wherein the one or more processors are further configured to:

receive one or more flatness measurements of the substrate as a function of position across the substrate from the dual interferometer sub-system;

receive one or more mass measurements of the substrate from the mass sensor;

determine an average thickness of the substrate based on the one or more mass measurements; and determine the thickness distribution of the substrate as a function of position across the substrate base on the one or more flatness measurements and the average thickness of the substrate.

13. The system of claim 11, wherein the dual interferometer sub-system comprises:

a dual wavelength dual Fizeau interferometer (DWDFI) sub-system.

14. The system of claim 11, wherein the mass sensor comprises:

a high precision weighing sensor.

15. The system of claim 11, wherein the substrate comprises:

a semiconductor wafer.

16. The system of claim 11, wherein the one or more processors are further configured to:

determine a thickness distribution of the film as a function of position across the substrate based on two or more flatness measurements of the substrate and two or more mass measurements of the substrate.

17. The system of claim 16, wherein the one or more processors are further configured to:

receive a first flatness measurement and a first mass measurement of a substrate prior to deposition of a film on the substrate;

determine an average thickness of the substrate based on the first mass measurement prior to deposition of the film on the substrate;

receive a second flatness measurement and a second mass measurement of a substrate following deposition of the film on the substrate;

determine an average thickness of the substrate based on the second mass measurement following deposition of the film on the substrate; and determine the thickness of the film as a function of position across the substrate based on the first flatness measurement and the first average thickness prior to deposition of the film and the second flatness measurement and the second average thickness of the substrate following deposition of the film on the substrate.

18. The system of claim 16, wherein the one or more processors are further configured to:

receive a first flatness measurement and a first mass measurement of a substrate prior to deposition of a film on the substrate and following deposition of one or more pre-layers on the substrate;

receive a second flatness measurement and a second mass measurement of the substrate following deposition of the film onto the pre-layers of the substrate; and determine the thickness of the film as a function of position across the substrate based on the density of the film, the first flatness measurement, the first mass of the substrate, the second flatness measurement and the second mass of the substrate.

* * * * *